United States Patent
Cheng et al.

(10) Patent No.: US 9,799,603 B2
(45) Date of Patent: Oct. 24, 2017

(54) SEMICONDUCTOR DEVICE STRUCTURE AND METHOD FOR FORMING THE SAME

(71) Applicant: Taiwan Semiconductor Manufacturing Co., Ltd., Hsinchu (TW)

(72) Inventors: Kai-Fang Cheng, Taoyuan (TW); Chi-Lin Teng, Taichung (TW); Hai-Ching Chen, Hsinchu (TW); Hsin-Yen Huang, New Taipei (TW); Tien-I Bao, Taoyuan (TW); Jung-Hsun Tsai, Taoyuan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/007,779

(22) Filed: Jan. 27, 2016

(65) Prior Publication Data

US 2017/0213791 A1    Jul. 27, 2017

(51) Int. Cl.
| | |
|---|---|
| H01L 21/4763 | (2006.01) |
| H01L 23/528 | (2006.01) |
| H01L 21/768 | (2006.01) |
| H01L 23/522 | (2006.01) |

(52) U.S. Cl.
CPC ...... H01L 23/5283 (2013.01); H01L 21/7681 (2013.01); H01L 21/76831 (2013.01); H01L 21/76877 (2013.01); H01L 23/5226 (2013.01)

(58) Field of Classification Search
CPC .......... H01L 21/76831; H01L 23/5226; H01L 21/76877
USPC ................... 438/622, 625, 637, 639
See application file for complete search history.

(56) References Cited

U.S. PATENT DOCUMENTS

| | | | |
|---|---|---|---|
| 8,242,015 B2* | 8/2012 | Matsumoto | C23C 16/045 257/751 |
| 2010/0025808 A1* | 2/2010 | Donkers | H01L 29/66242 257/526 |
| 2010/0258852 A1* | 10/2010 | Lim | H01L 27/11551 257/324 |
| 2017/0053868 A1* | 2/2017 | Lin | H01L 23/5226 |
| 2017/0084534 A1* | 3/2017 | Chen | H01L 23/5226 |

* cited by examiner

*Primary Examiner* — S. V. Clark
(74) *Attorney, Agent, or Firm* — Birch, Stewart, Kolasch & Birch, LLP

(57) ABSTRACT

A semiconductor device structure is provided. The semiconductor device structure includes a substrate. The semiconductor device structure includes a first conductive structure over the substrate. The semiconductor device structure includes a first dielectric layer over the substrate. The first dielectric layer has a first opening exposing the first conductive structure. The semiconductor device structure includes a cover layer covering a first inner wall of the first opening. The cover layer has a second opening exposing the first conductive structure. The cover layer includes a metal oxide. The semiconductor device structure includes a second conductive structure filled in the first opening and surrounded by the cover layer. The second conductive structure is electrically connected to the first conductive structure.

20 Claims, 17 Drawing Sheets

SEMICONDUCTOR DEVICE STRUCTURE AND METHOD FOR FORMING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers over a semiconductor substrate, and patterning the various material layers using lithography to form circuit components and elements.

One of the important drivers for increased performance in semiconductor devices is the higher levels of integration of circuits. This is accomplished by miniaturizing or shrinking device sizes on a given chip. Tolerance plays an important role in being able to shrink the dimensions of a chip.

However, although existing manufacturing processes for forming semiconductor devices have been generally adequate for their intended purposes, as device scaling-down continues, they have not been entirely satisfactory in all respects.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

Figure 1A:
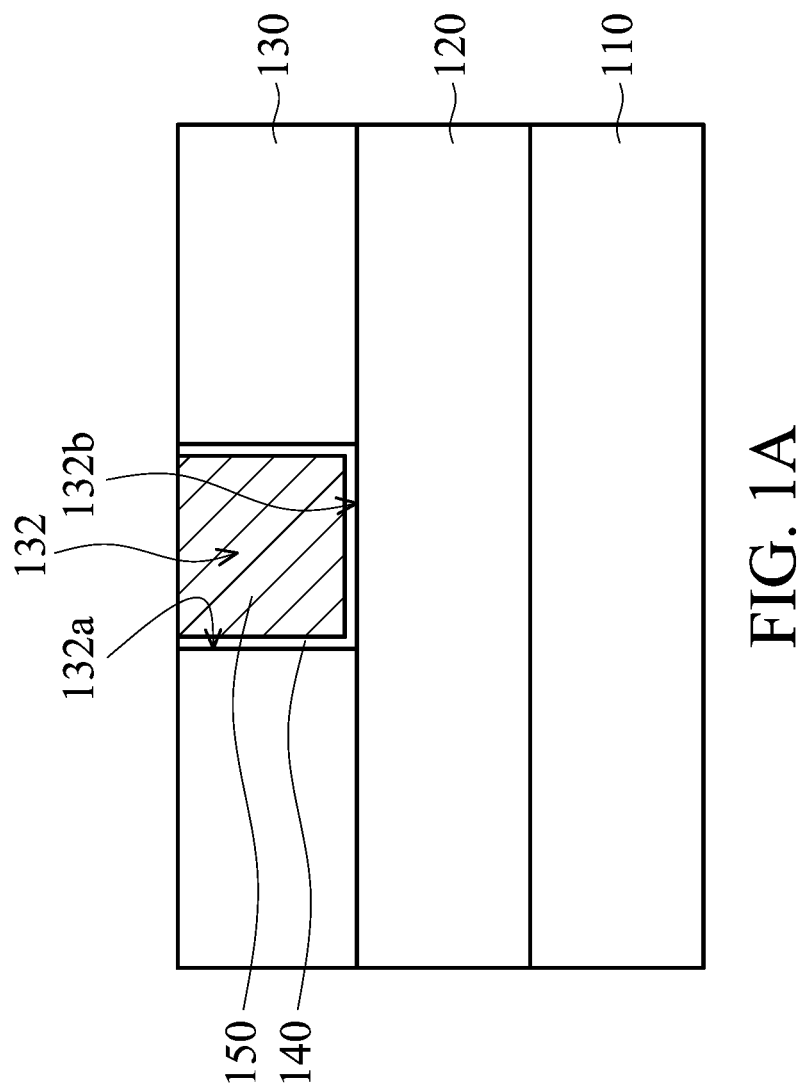
FIGS. 1A-1G are cross-sectional views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

FIGS. 1A-1G are cross-sectional views of various stages of a process for forming a semiconductor device structure 100, in accordance with some embodiments. As shown in FIG. 1A, a substrate 110 is provided, in accordance with some embodiments. The substrate 110 may be a semiconductor wafer such as a silicon wafer. Alternatively or additionally, the substrate 110 may include elementary semiconductor materials, compound semiconductor materials, and/or alloy semiconductor materials.

Examples of the elementary semiconductor materials may be, but are not limited to, crystal silicon, polycrystalline silicon, amorphous silicon, germanium, and/or diamond. Examples of the compound semiconductor materials may be, but are not limited to, silicon carbide, gallium arsenic, gallium phosphide, indium phosphide, indium arsenide, and/or indium antimonide. Examples of the alloy semiconductor materials may be, but are not limited to, SiGe, GaAsP, AlInAs, AlGaAs, GaInAs, GaInP, and/or GaInAsP.

In some embodiments, an isolation structure (not shown) is formed in the semiconductor substrate 110. The isolation structure surrounds active regions of the semiconductor substrate 110, in accordance with some embodiments. The isolation structure is configured to define and electrically isolate the active regions and various device elements (not shown) formed in the semiconductor substrate 110, in accordance with some embodiments.

Examples of device elements may include, but are not limited to, transistors, diodes, and/or other applicable elements. Examples of the transistors may include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), or the like. Various processes are performed to form the device elements, such as deposition, etching, implantation, photolithography, annealing, and/or other applicable processes.

As shown in FIG. 1A, a dielectric layer 120 is formed over the substrate 110, in accordance with some embodiments. The dielectric layer 120 includes oxide, such as $SiO_2$, borophosphosilicate glass (BPSG), spin on glass (SOG), undoped silicate glass (USG), fluorinated silicate glass (FSG), high-density plasma (HDP) oxide, or plasma-enhanced TEOS (PETEOS), in accordance with some embodiments.

The dielectric layer 120 may include multilayers made of multiple dielectric materials, such as a low dielectric constant or an extreme low dielectric constant (ELK) material. The dielectric layer 120 is formed by chemical vapor deposition (CVD), physical vapor deposition (PVD), atomic layer deposition (ALD), spin-on coating, or another applicable process.

In some embodiments, interconnection structures and/or device elements (not shown) are formed in the dielectric layer 120. The interconnection structures include conductive lines and conductive vias, in accordance with some embodiments. The device elements include transistors, diodes, capacitors, and/or other applicable elements. In some other embodiments, the dielectric layer 120 is not formed.

As shown in FIG. 1A, a dielectric layer 130 is formed over the dielectric layer 120, in accordance with some embodiments. The dielectric layer 130 includes oxide, such as SiO$_2$, borophosphosilicate glass (BPSG), spin on glass (SOG), undoped silicate glass (USG), fluorinated silicate glass (FSG), high-density plasma (HDP) oxide, or plasma-enhanced TEOS (PETEOS), in accordance with some embodiments.

The dielectric layer 130 includes a low dielectric constant or an extreme low dielectric constant (ELK) material, in accordance with some embodiments. The dielectric layer 130 is formed by chemical vapor deposition (CVD), physical vapor deposition (PVD), atomic layer deposition (ALD), spin-on coating, or another applicable process.

As shown in FIG. 1A, the dielectric layer 130 has a recess 132, in accordance with some embodiments. The recess 132 exposes a portion of the dielectric layer 120, in accordance with some embodiments. As shown in FIG. 1A, a cover layer 140 is formed over sidewalls 132a and a bottom surface 132b of the recess 132, in accordance with some embodiments. The cover layer 140 is a seal layer and/or a barrier layer, in accordance with some embodiments.

The cover layer 140 is configured to seal pores formed on the sidewalls 132a and the bottom surface 132b, in accordance with some embodiments. The pores are formed during the formation of the recess 132, in accordance with some embodiments. The cover layer 140 is configured to prevent diffusion of metal materials formed in the recess 132 into the dielectric layer 130, in accordance with some embodiments. The cover layer 140 conformally covers the sidewalls 132a and the bottom surface 132b of the recess 132, in accordance with some embodiments.

The cover layer 140 includes tantalum (Ta), tantalum nitride (TaN), SiN, SiC, or SiCN, in accordance with some embodiments. In some embodiments, the cover layer 140 includes a metal oxide. The cover layer 140 is formed using a physical vapor deposition (PVD) process, a chemical vapor deposition (CVD) process, an atomic layer deposition (ALD) process, or another suitable process.

As shown in FIG. 1A, a conductive structure 150 is formed in the recess 132 and over the cover layer 140, in accordance with some embodiments. The conductive structure 150 is filled in the recess 132, in accordance with some embodiments. The dielectric layer 130 surrounds the conductive structure 150 and the cover layer 140, in accordance with some embodiments. The conductive structure 150 includes a conductive line, a conductive via, or another suitable interconnection structure, in accordance with some embodiments.

The conductive structure 150 includes copper, aluminum, tungsten, or another suitable conductive material. The conductive structure 150 is formed using a deposition process and a chemical mechanical polishing (CMP) process, in accordance with some embodiments. The deposition process includes a physical vapor deposition (PVD) process, a chemical vapor deposition (CVD) process, or another suitable deposition process.

Figure 1B:
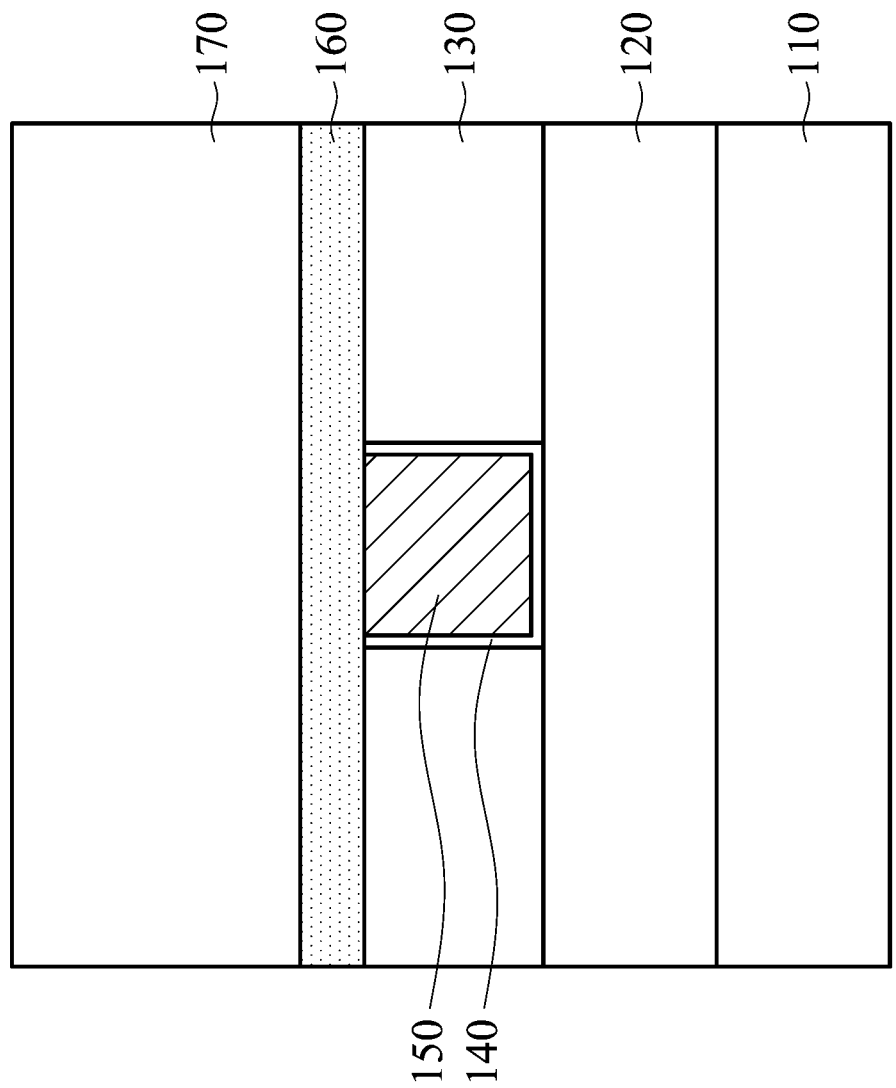

As shown in FIG. 1B, an etch stop layer 160 is formed over the dielectric layer 130, the cover layer 140, and the conductive structure 150, in accordance with some embodiments. The etch stop layer 160 includes silicon nitride, silicon oxide, or another suitable material. The etch stop layer 160 is formed using a chemical vapor deposition process, in accordance with some embodiments.

As shown in FIG. 1B, a dielectric layer 170 is formed over the etch stop layer 160, in accordance with some embodiments. The dielectric layer 170 includes oxide, such as SiO$_2$, borophosphosilicate glass (BPSG), spin on glass (SOG), undoped silicate glass (USG), fluorinated silicate glass (FSG), high-density plasma (HDP) oxide, or plasma-enhanced TEOS (PETEOS), in accordance with some embodiments.

The dielectric layer 170 includes a low dielectric constant or an extreme low dielectric constant (ELK) material, in accordance with some embodiments. The dielectric layer 170 is formed by chemical vapor deposition (CVD), physical vapor deposition (PVD), atomic layer deposition (ALD), spin-on coating, or another applicable process.

Figure 1C:
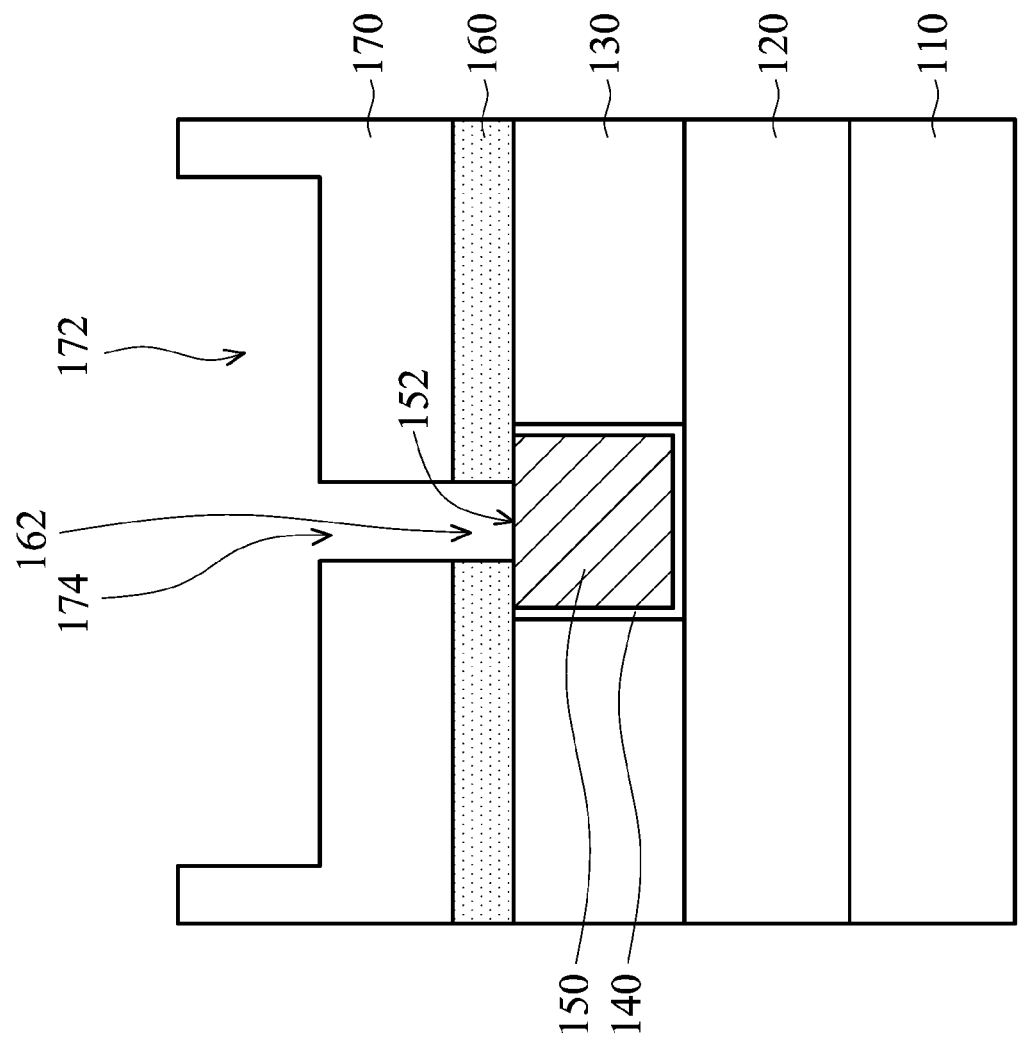

As shown in FIG. 1C, portions of the dielectric layer 170 and the etch stop layer 160 are removed, in accordance with some embodiments. After the removal process, a trench 172 and an opening 174 are formed in the dielectric layer 170, and an opening 162 is formed in the etch stop layer 160, in accordance with some embodiments.

The trench 172 is over and connected to the openings 174 and 162, in accordance with some embodiments. The trench 172 and the openings 174 and 162 communicate with each other, in accordance with some embodiments. The trench 172 and the openings 174 and 162 expose a portion of a top surface 152 of the conductive structure 150, in accordance with some embodiments.

Figure 1D:
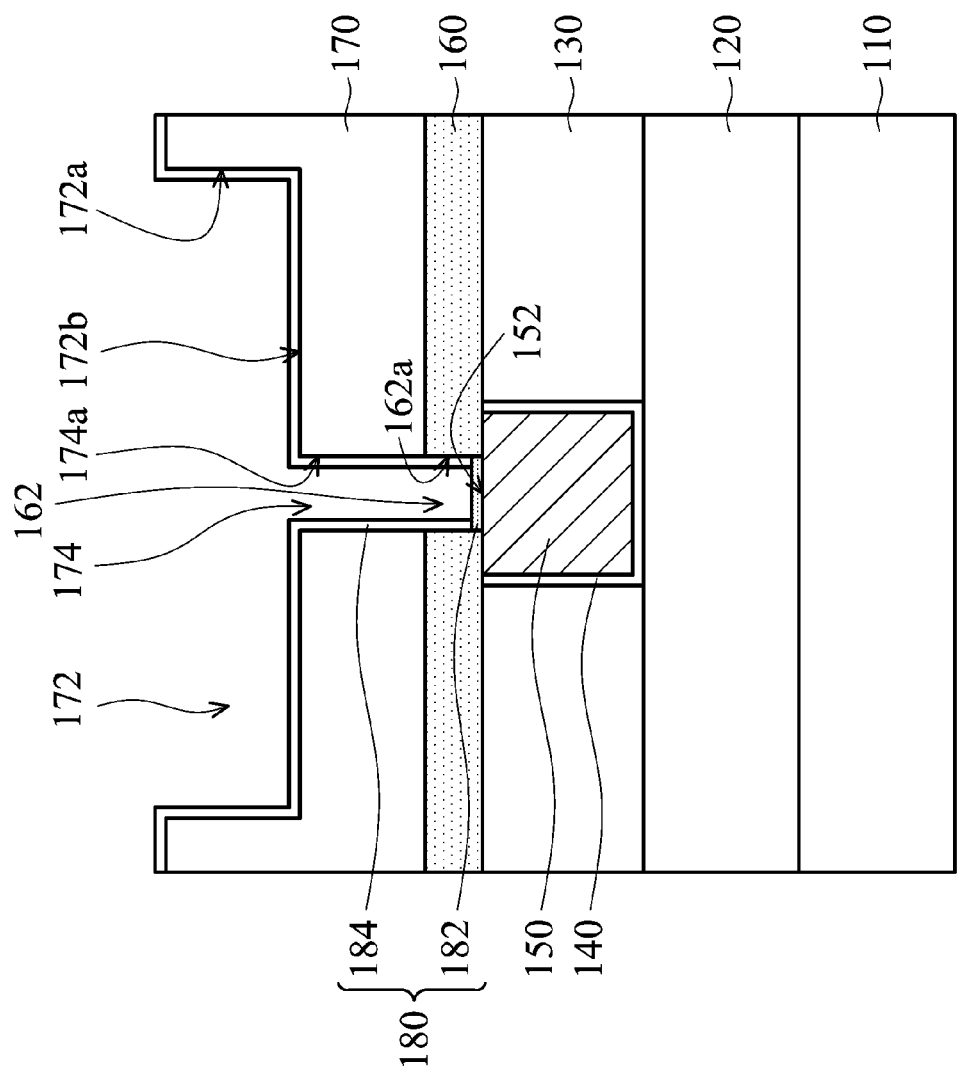

As shown in FIG. 1D, a deposition process is performed on the dielectric layer 170, the etch stop layer 160, and the conductive structure 150 to form a deposition layer 180, in accordance with some embodiments. The deposition layer 180 is formed over the dielectric layer 170, the etch stop layer 160, and the conductive structure 150, in accordance with some embodiments.

The deposition layer 180 is formed over an inner wall 172a and a bottom surface 172b of the trench 172, an inner wall 174a of the opening 174, an inner wall 162a of the opening 162, and the top surface 152 of the conductive structure 150, in accordance with some embodiments. The deposition layer 180 conformally and continuously covers the inner walls 172a, 174a, and 162a, the bottom surface 172b, and the top surface 152, in accordance with some embodiments.

The deposition layer 180 has a first portion 182 and a second portion 184 connected to each other, in accordance with some embodiments. The first portion 182 is over the conductive structure 150, in accordance with some embodiments. The first portion 182 covers the top surface 152, in accordance with some embodiments. The first portion 182 is in direct contact with the conductive structure 150, in accordance with some embodiments.

The second portion 184 is over the etch stop layer 160 and the dielectric layer 170, in accordance with some embodiments. The second portion 184 covers the inner walls 172a, 174a, and 162a and the bottom surface 172b, in accordance with some embodiments. The second portion 184 is in direct contact with the etch stop layer 160 and the dielectric layer 170, in accordance with some embodiments. The first portion 182 is in direct contact with the second portion 184, in accordance with some embodiments.

Since the surface properties of a conductive material and a dielectric material are different, the deposited material formed on the conductive structure 150 and the deposited material formed on the etch stop layer 160 and the dielectric layer 170 are different, in accordance with some embodiments. That is, the first portion 182 and the second portion 184 are made of different materials, in accordance with some embodiments.

The first portion 182 is made of a metal oxynitride, and the second portion 184 is made of a metal oxide, in accordance with some embodiments. The first portion 182 and the second portion 184 include the same metal element, in accordance with some embodiments. The metal element includes aluminum (Al), titanium (Ti), zirconium (Zr), tantalum (Ta), or another suitable metal element.

In some embodiments, the first portion 182 includes aluminum oxynitride, and the second portion 184 includes aluminum oxide. In some embodiments, the first portion 182 includes titanium oxynitride, and the second portion 184 includes titanium oxide. In some embodiments, the first portion 182 includes zirconium oxynitride, and the second portion 184 includes zirconium oxide. In some embodiments, the first portion 182 includes tantalum oxynitride, and the second portion 184 includes tantalum oxide.

The deposition process includes an atomic layer deposition (ALD) process, a chemical vapor deposition (CVD) process, or another suitable process. In some embodiments, the deposition process uses TMA (trimethyl aluminum; $Al(CH_3)_3$) as an aluminum source and uses $NH_3$ as a reaction gas.

Figure 1E:
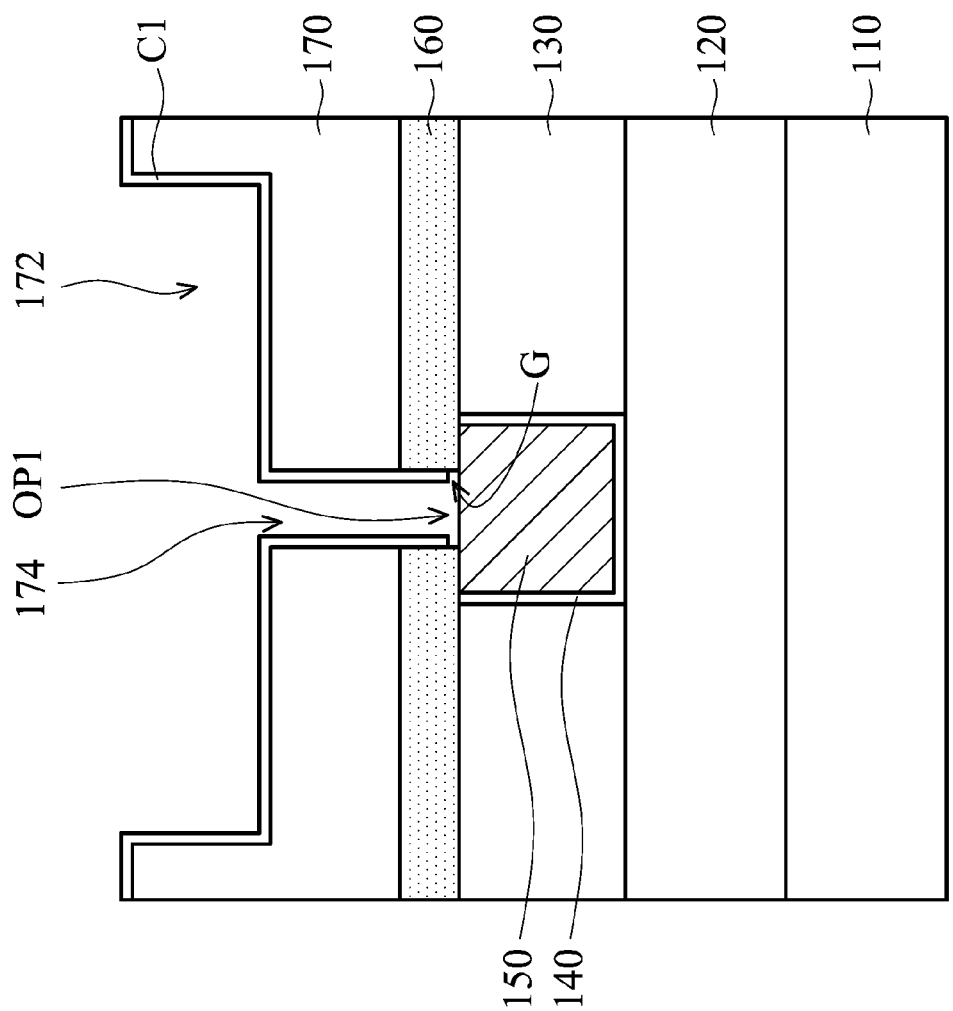

As shown in FIG. 1E, the first portion 182 is removed, in accordance with some embodiments. The removal process includes a selective etching process, in accordance with some embodiments. The selective etching process includes a wet etching process, in accordance with some embodiments. Since the first portion 182 and the second portion 184 are made of different materials, the etchants of the selective etching process are able to remove the first portion 182 at a greater rate than the removal rate of the second portion 184, in accordance with some embodiments.

As shown in FIG. 1E, after the removal process, the second portion 184 forms a cover layer C1, in accordance with some embodiments. After the removal process, a gap G is formed between the cover layer C1 and the conductive structure 150, in accordance with some embodiments. The cover layer C1 and the conductive structure 150 are spaced apart by the gap G, in accordance with some embodiments. The cover layer C1 has an opening OP1 exposing the conductive structure 150, in accordance with some embodiments.

Figure 1F:
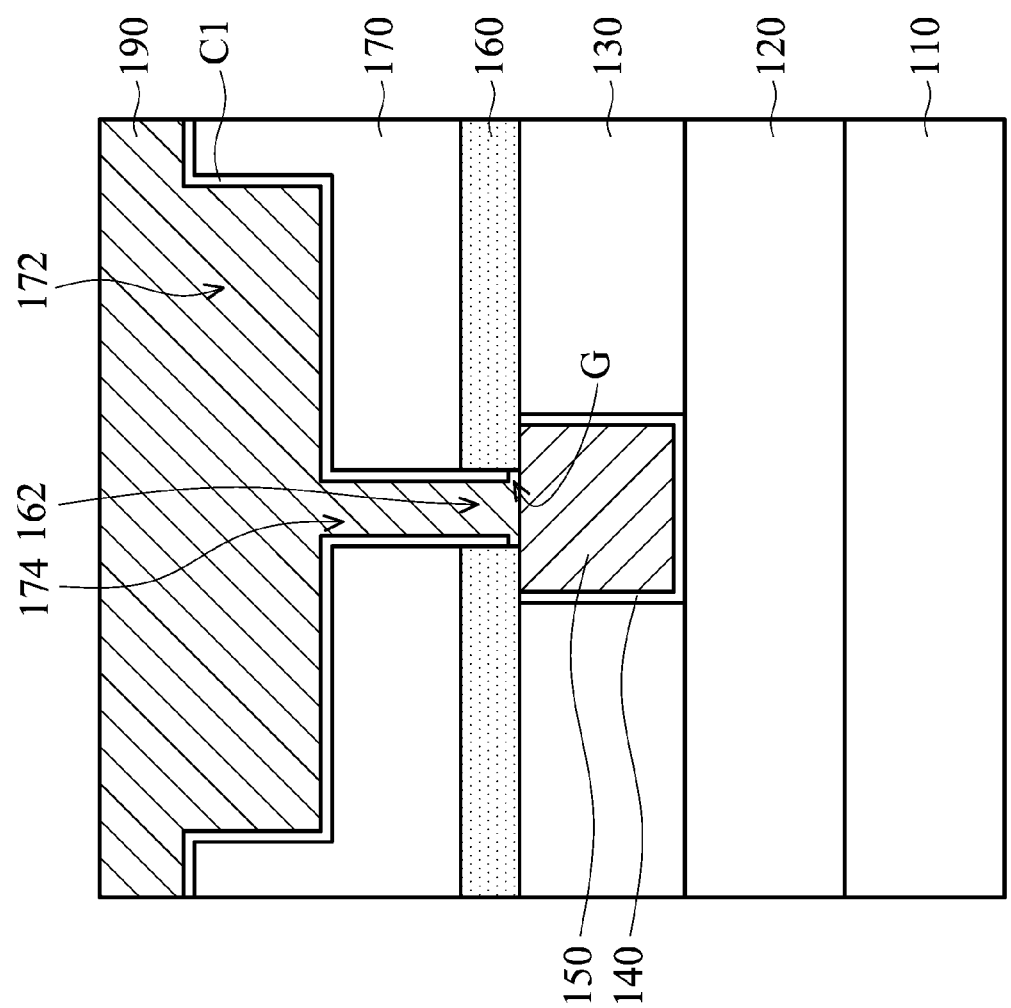

As shown in FIG. 1F, a conductive layer 190 is deposited over the cover layer C1, the etch stop layer 160, and the conductive structure 150 to fill the trench 172, the openings 174 and 162, and the gap G, in accordance with some embodiments. The conductive layer 190 includes copper, aluminum, tungsten, or another suitable conductive material. The conductive layer 190 is formed using a deposition process, in accordance with some embodiments. The deposition process includes a physical vapor deposition (PVD) process, a chemical vapor deposition (CVD) process, or another suitable deposition process.

Figure 1G:
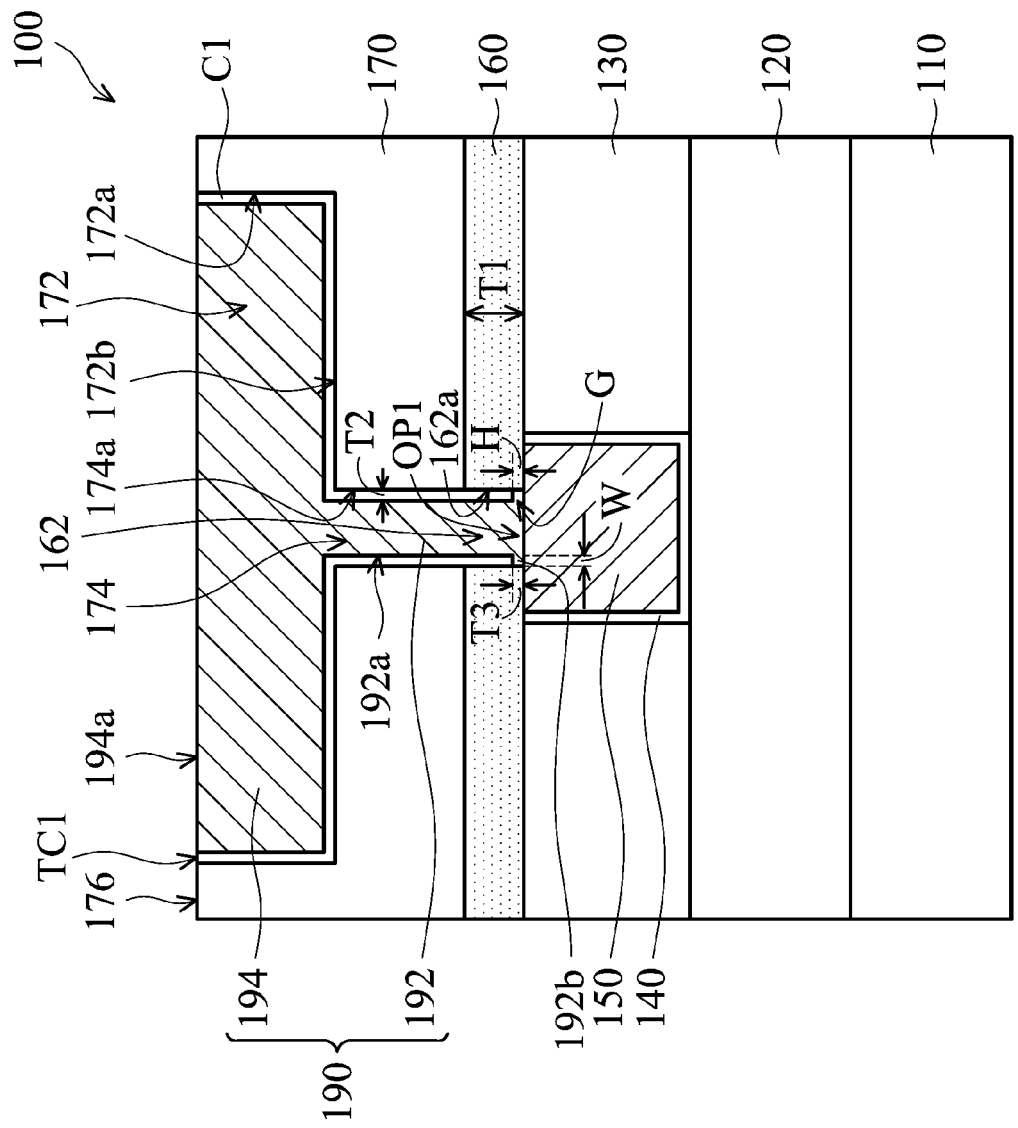

As shown in FIG. 1G, top portions of the conductive layer 190 and the cover layer C1 are removed, in accordance with some embodiments. The removal process includes a chemical mechanical polishing process, in accordance with some embodiments. After the removal process, the remaining conductive layer 190 forms a conductive structure 192 and a conductive line 194, in accordance with some embodiments.

The conductive structure 192 is filled in the openings 174 and 162 and the gap G, in accordance with some embodiments. The conductive line 194 is filled in the trench 172, in accordance with some embodiments. The conductive line 194 and the conductive structures 150 and 192 are electrically connected with each other, in accordance with some embodiments.

After the removal process, top surfaces 176, TC1, and 194a of the dielectric layer 170, the cover layer C1, and the conductive line 194 are aligned with each other, in accordance with some embodiments. In this step, a semiconductor device structure 100 is substantially formed, in accordance with some embodiments.

The conductive structure 192 extends through the opening OP1 of the cover layer C1 and is therefore in direct contact with the conductive structure 150, in accordance with some embodiments. Since there is no barrier layer and no seal layer between the conductive structures 150 and 192, the conductive structure 192 is able to be in direct contact with the conductive structure 150, which reduces the resistance between the conductive structures 192 and 150. Therefore, the performance of the semiconductor device structure 100 is improved, in accordance with some embodiments.

Furthermore, since the gap G is formed between the cover layer C1 and the conductive structures 150, and the conductive structure 192 is filled into the gap G, the contact area between the conductive structures 192 and 150 is not reduced by the cover layer C1, in accordance with some embodiments. That is, the contact area between the conductive structures 192 and 150 is substantially equal to the cross-sectional area of the opening 162, in accordance with some embodiments. Therefore, the resistance between the conductive structures 192 and 150 is reduced, in accordance with some embodiments. In some other embodiments, the etch stop layer 160 is not formed, and the contact area between the conductive structures 192 and 150 is substantially equal to the cross-sectional area of the opening 174.

The cover layer C1 continuously covers the inner wall 172a and the bottom surface 172b of the trench 172, the inner wall 174a of the opening 174, and the inner wall 162a of the opening 162, in accordance with some embodiments. The cover layer C1 surrounds only an upper portion 192a of the conductive structure 192, in accordance with some embodiments. The cover layer C1 is in direct contact with the dielectric layer 170 and the etch stop layer 160 and is not in direct contact with the conductive structure 150, in accordance with some embodiments.

The gap G exposes a portion of the inner wall 162a, in accordance with some embodiments. The gap G has a height H that is less than a thickness T1 of the etching stop layer 160, in accordance with some embodiments. The height H of the gap G is substantially equal to a thickness T2 of the cover layer C1, in accordance with some embodiments. In some embodiments, the thickness T2 of the cover layer C1 ranges from about 20 Å to about 30 Å.

The conductive structure 192 has an extending portion 192b extending between the cover layer C1 and the conductive structure 150, in accordance with some embodiments. The extending portion 192b separates the cover layer C1 from the conductive structure 150, in accordance with some embodiments.

The extending portion 192b has a thickness T3 that is substantially equal to the thickness T2 of the cover layer C1, in accordance with some embodiments. The extending portion 192b has a width W that is substantially equal to the thickness T2 of the cover layer C1, in accordance with some embodiments.

The thickness T3 of the extending portion 192b is less than the thickness T1 of the etching stop layer 160, in accordance with some embodiments. The extending portion 192b is in direct contact with the etching stop layer 160, in accordance with some embodiments. In some other embodiments, the etching stop layer 160 is not formed, and the extending portion 192b is in direct contact with the dielectric layer 170.

Figure 2A:
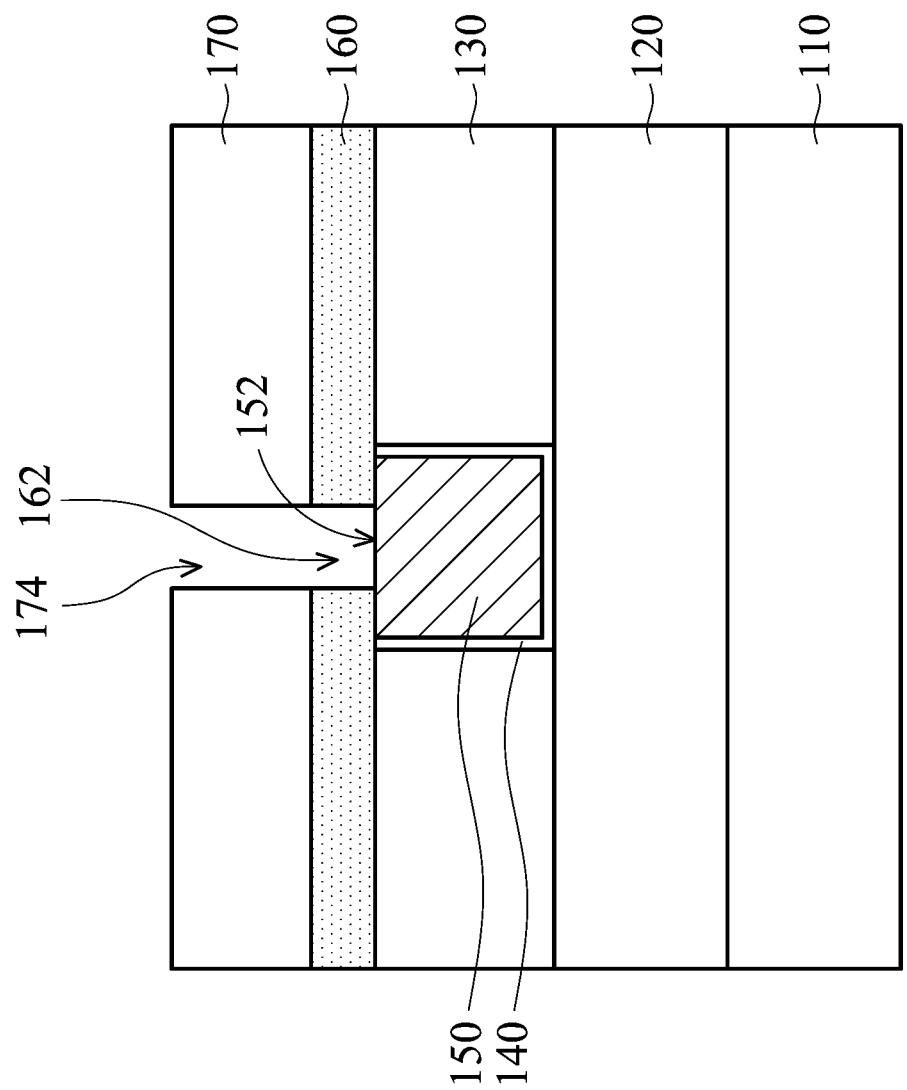
FIGS. 2A-2J are cross-sectional views of various stages of a process for forming a semiconductor device structure, in accordance with some embodiments.

FIGS. 2A-2J are cross-sectional views of various stages of a process for forming a semiconductor device structure 200, in accordance with some embodiments. After the step of FIG. 1B, as shown in FIG. 2A, portions of the dielectric layer 170 and the etch stop layer 160 are removed, in accordance with some embodiments.

After the removal process, an opening 174 is formed in the dielectric layer 170, and an opening 162 is formed in the etch stop layer 160, in accordance with some embodiments. The openings 174 and 162 communicate with each other, in accordance with some embodiments. The openings 174 and 162 expose a portion of a top surface 152 of the conductive structure 150, in accordance with some embodiments.

Figure 2B:
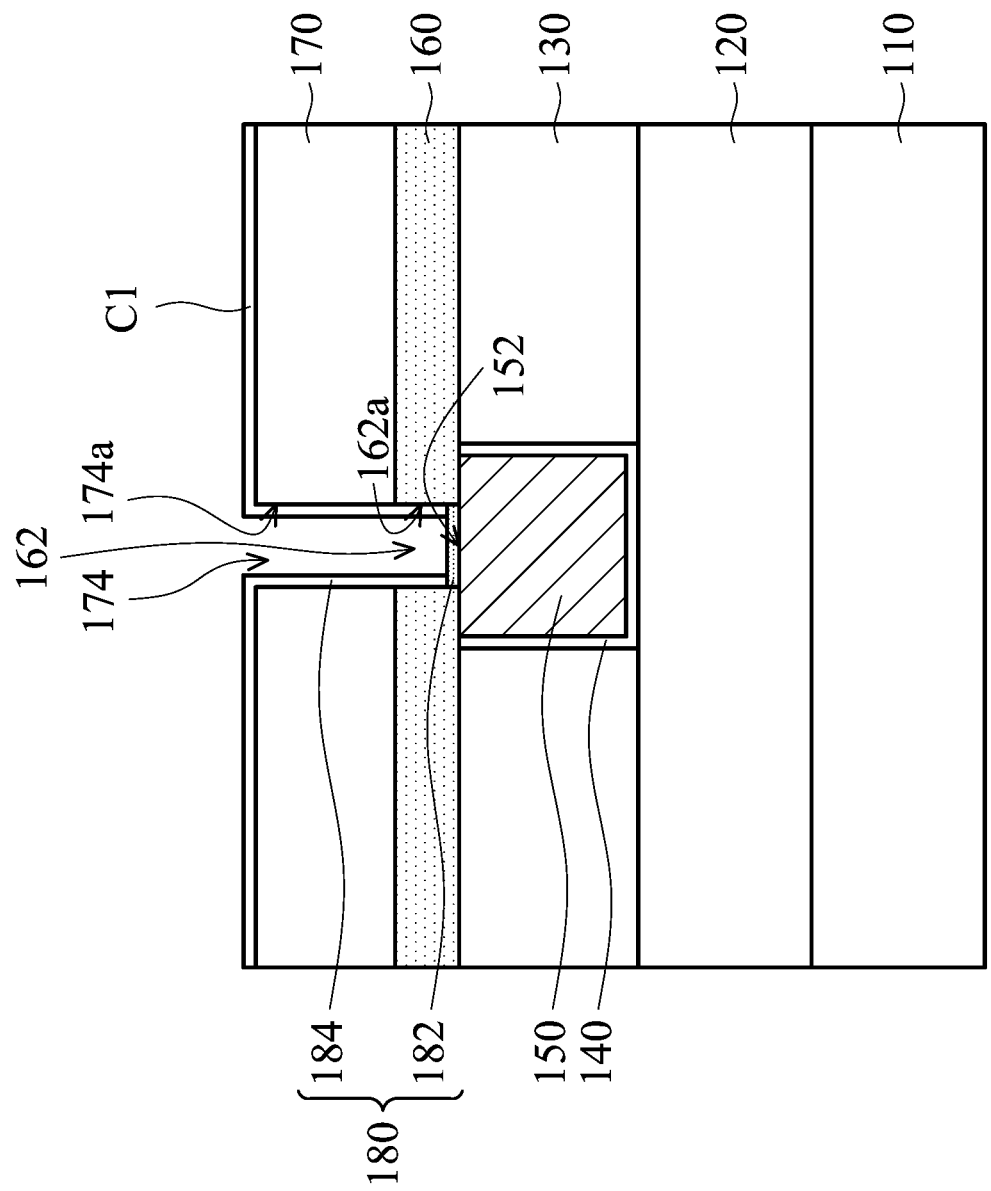

As shown in FIG. 2B, a deposition process is performed on the dielectric layer 170, the etch stop layer 160, and the conductive structure 150 to form a deposition layer 180, in accordance with some embodiments. The deposition layer 180 is formed over the dielectric layer 170, the etch stop layer 160, and the conductive structure 150, in accordance with some embodiments.

The deposition layer 180 is formed over an inner wall 174a of the opening 174, an inner wall 162a of the opening 162, and the top surface 152 of the conductive structure 150, in accordance with some embodiments. The deposition layer 180 conformally and continuously covers the inner walls 174a and 162a and the top surface 152, in accordance with some embodiments.

The deposition layer 180 has a first portion 182 and a second portion 184 connected to each other, in accordance with some embodiments. The first portion 182 is over the conductive structure 150, in accordance with some embodiments. The first portion 182 covers the top surface 152, in accordance with some embodiments. The first portion 182 is in direct contact with the conductive structure 150, in accordance with some embodiments.

The second portion 184 is over the etch stop layer 160 and the dielectric layer 170, in accordance with some embodiments. The second portion 184 covers the inner walls 174a and 162a, in accordance with some embodiments. The second portion 184 is in direct contact with the etch stop layer 160 and the dielectric layer 170, in accordance with some embodiments. The first portion 182 is in direct contact with the second portion 184, in accordance with some embodiments.

Since the surface properties of a conductive material and a dielectric material are different, the first portion 182 and the second portion 184 are made of different materials, in accordance with some embodiments. The first portion 182 is made of a metal oxynitride, and the second portion 184 is made of a metal oxide, in accordance with some embodiments. The first portion 182 and the second portion 184 include a same metal element, in accordance with some embodiments. The metal element includes aluminum (Al), titanium (Ti), zirconium (Zr), tantalum (Ta), or another suitable metal element.

In some embodiments, the first portion 182 includes aluminum oxynitride, and the second portion 184 includes aluminum oxide. In some embodiments, the first portion 182 includes titanium oxynitride, and the second portion 184 includes titanium oxide. In some embodiments, the first portion 182 includes zirconium oxynitride, and the second portion 184 includes zirconium oxide. In some embodiments, the first portion 182 includes tantalum oxynitride, and the second portion 184 includes tantalum oxide.

The deposition process includes an atomic layer deposition (ALD) process, a chemical vapor deposition (CVD) process, or another suitable process. In some embodiments, the deposition process uses TMA (trimethyl aluminum; $Al(CH_3)_3$) as an aluminum source and uses $NH_3$ as a reaction gas.

Figure 2C:
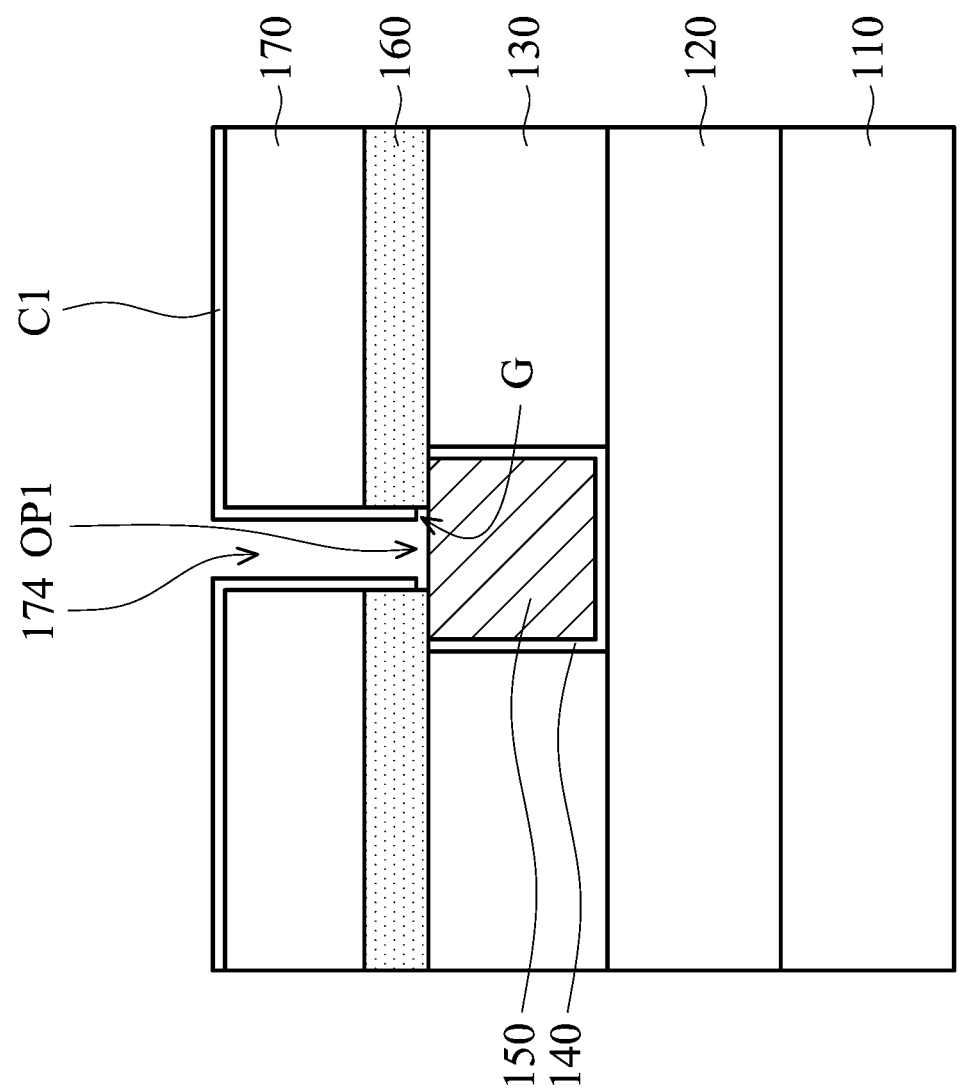

As shown in FIG. 2C, the first portion 182 is removed, in accordance with some embodiments. The removal process includes a selective etching process, in accordance with some embodiments. The selective etching process includes a wet etching process, in accordance with some embodiments.

As shown in FIG. 2C, after the removal process, the second portion 184 forms a cover layer C1, in accordance with some embodiments. After the removal process, a gap G is formed between the cover layer C1 and the conductive structure 150, in accordance with some embodiments. The cover layer C1 and the conductive structure 150 are spaced apart by the gap G, in accordance with some embodiments. The cover layer C1 has an opening OP1 exposing the conductive structure 150, in accordance with some embodiments.

Figure 2D:
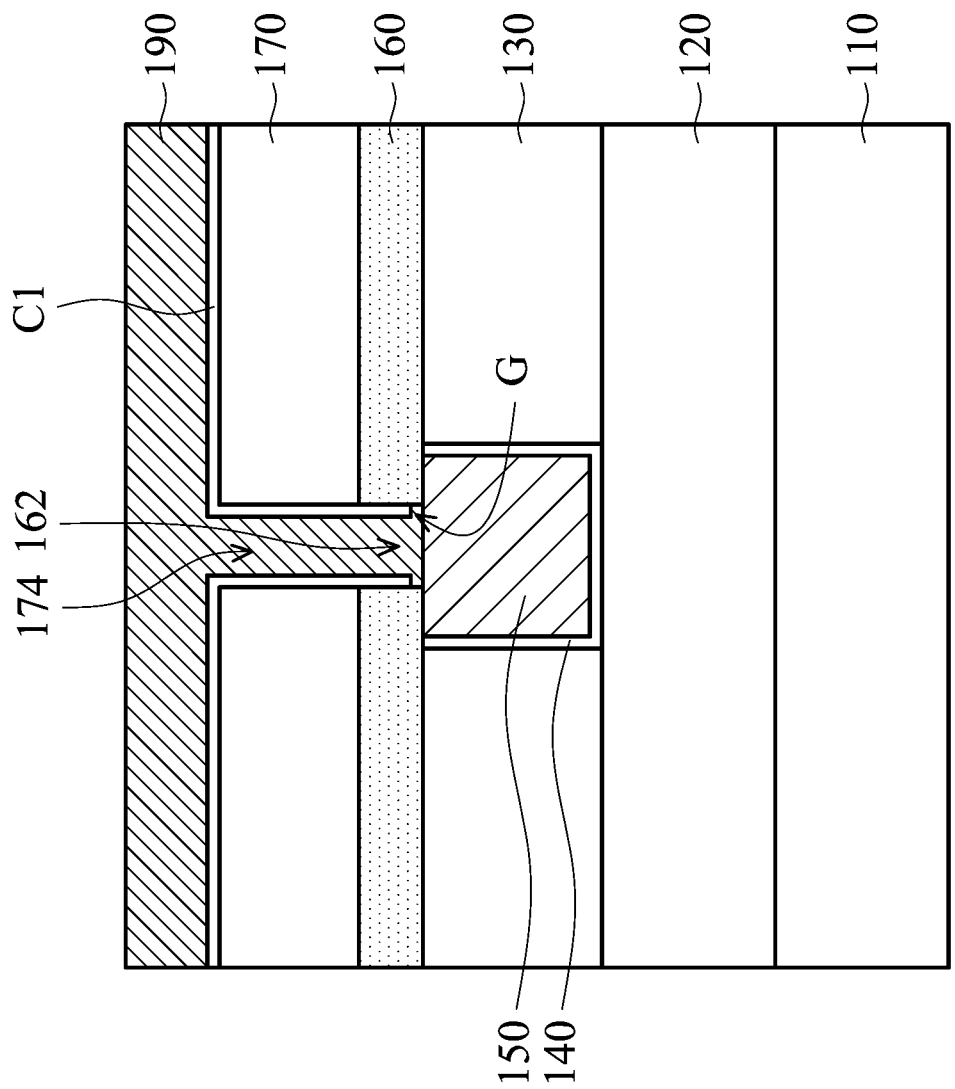

As shown in FIG. 2D, a conductive layer 190 is deposited over the cover layer C1, the etch stop layer 160, and the conductive structure 150 to fill the openings 174 and 162 and the gap G, in accordance with some embodiments. The conductive layer 190 includes copper, aluminum, tungsten, or another suitable conductive material.

The conductive layer 190 is formed using a deposition process, in accordance with some embodiments. The deposition process includes a physical vapor deposition (PVD) process, a chemical vapor deposition (CVD) process, or another suitable deposition process.

Figure 2E:
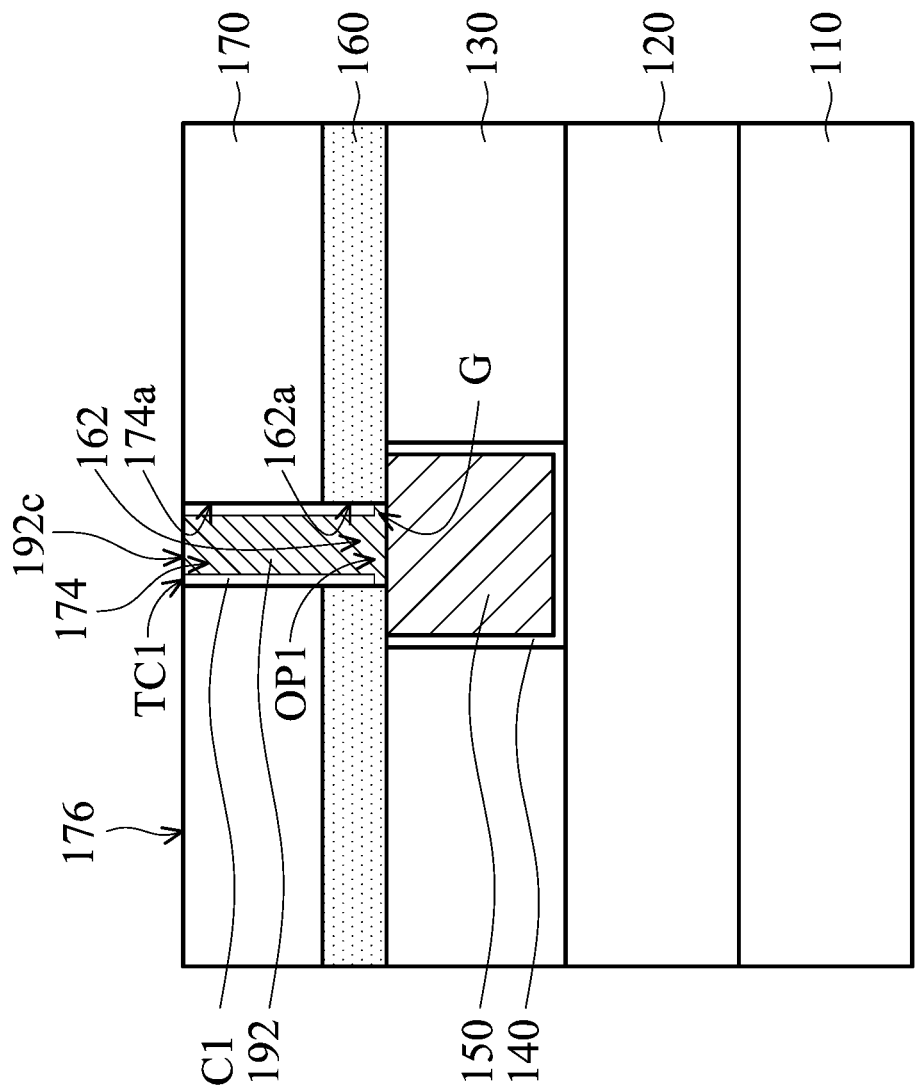

As shown in FIG. 2E, top portions of the conductive layer 190 and the cover layer C1 are removed, in accordance with some embodiments. The removal process includes a chemical mechanical polishing process, in accordance with some embodiments. After the removal process, the remaining conductive layer 190 forms a conductive structure 192, in accordance with some embodiments.

The conductive structure 192 is filled in the openings 174 and 162 and the gap G, in accordance with some embodiments. The conductive structures 150 and 192 are electrically connected with each other, in accordance with some embodiments. After the removal process, top surfaces 176, TC1, and 192c of the dielectric layer 170, the cover layer C1, and the conductive structure 192 are aligned with each other, in accordance with some embodiments.

The conductive structure 192 extends through the opening OP1 of the cover layer C1 and is therefore in direct contact with the conductive structure 150, in accordance with some embodiments. Since there is no barrier layer and no seal layer between the conductive structures 150 and 192, the conductive structure 192 is able to be in direct contact with the conductive structure 150, which reduces the resistance between the conductive structures 192 and 150.

Figure 2F:
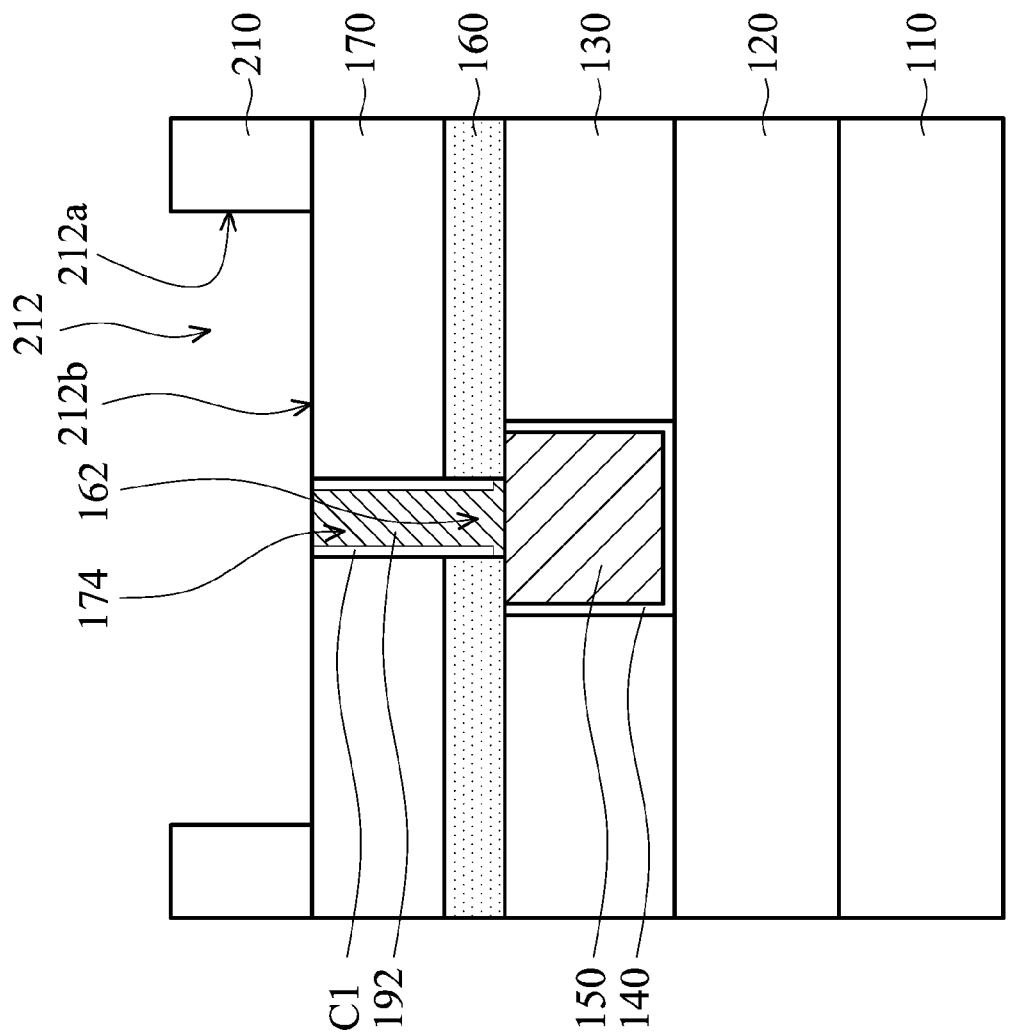

As shown in FIG. 2F, a dielectric layer 210 is formed over the dielectric layer 170, in accordance with some embodiments. The dielectric layer 210 includes oxide, such as $SiO_2$, borophosphosilicate glass (BPSG), spin on glass (SOG), undoped silicate glass (USG), fluorinated silicate glass (FSG), high-density plasma (HDP) oxide, or plasma-enhanced TEOS (PETEOS), in accordance with some embodiments.

The dielectric layer 210 includes a low dielectric constant or an extreme low dielectric constant (ELK) material, in accordance with some embodiments. The dielectric layer 210 is formed by chemical vapor deposition (CVD), physical vapor deposition (PVD), atomic layer deposition (ALD), spin-on coating, or another applicable process.

As shown in FIG. 2F, a portion of the dielectric layer 210 is removed, in accordance with some embodiments. After the removal process, a trench 212 is formed in the dielectric layer 210, in accordance with some embodiments. The trench 212 is over the opening 174, in accordance with some embodiments. The trench 212 exposes the conductive structure 192, the cover layer C1, and a portion of the dielectric layer 170, in accordance with some embodiments.

Figure 2G:
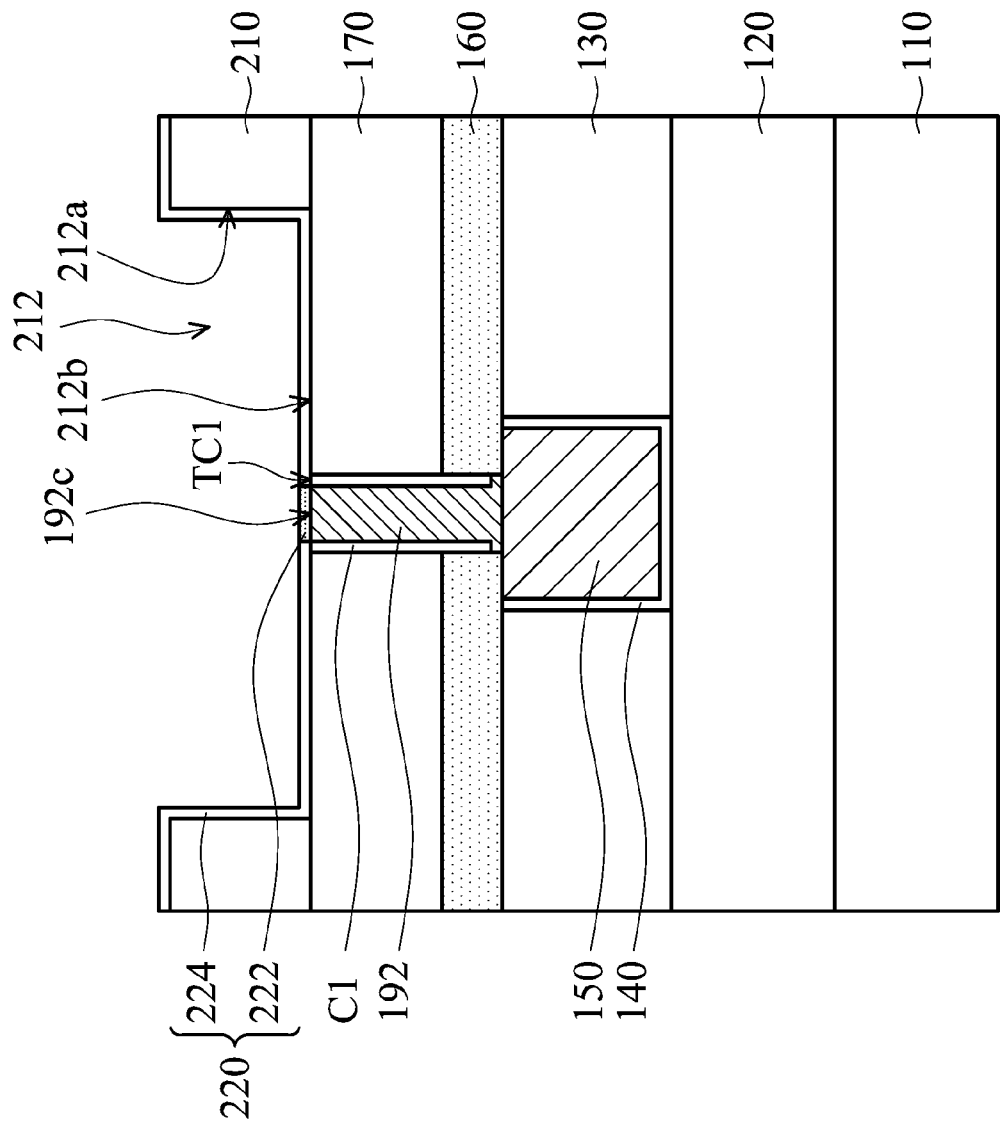

As shown in FIG. 2G, a deposition process is performed on the dielectric layers 210 and 170, the cover layer C1, and the conductive structure 192 to form a deposition layer 220, in accordance with some embodiments. The deposition layer 220 is formed over the dielectric layers 210 and 170, the cover layer C1, and the conductive structure 192, in accordance with some embodiments.

The deposition layer 220 is formed over an inner wall 212a and a bottom surface 212b of the trench 212, the top surface TC1 of the cover layer C1, and the top surface 192c of the conductive structure 192, in accordance with some embodiments. The deposition layer 220 conformally and continuously covers the inner wall 212a, the bottom surface 212b, and the top surfaces 192c and TC1, in accordance with some embodiments.

The deposition layer 220 has a first portion 222 and a second portion 224 connected to each other, in accordance with some embodiments. The first portion 222 is over the conductive structure 192, in accordance with some embodiments. The first portion 222 covers the top surface 192c, in accordance with some embodiments. The first portion 222 is in direct contact with the conductive structure 192, in accordance with some embodiments.

The second portion 224 is over the dielectric layers 170 and 210 and the cover layer C1, in accordance with some embodiments. The second portion 224 covers the inner wall 212a, the bottom surface 212b, and the top surface TC1, in accordance with some embodiments. The second portion 224 is in direct contact with the dielectric layers 170 and 210 and the cover layer C1, in accordance with some embodiments. The first portion 222 is in direct contact with the second portion 224, in accordance with some embodiments.

Since the surface properties of a conductive material and a dielectric material are different, the first portion 222 and the second portion 224 are made of different materials, in accordance with some embodiments. The first portion 222 is made of a metal oxynitride, and the second portion 224 is made of a metal oxide, in accordance with some embodiments. The first portion 222 and the second portion 224 include the same metal element, in accordance with some embodiments. The metal element includes aluminum (Al), titanium (Ti), zirconium (Zr), tantalum (Ta), or another suitable metal element.

In some embodiments, the first portion 222 includes aluminum oxynitride, and the second portion 224 includes aluminum oxide. In some embodiments, the first portion 222 includes titanium oxynitride, and the second portion 224 includes titanium oxide. In some embodiments, the first portion 222 includes zirconium oxynitride, and the second portion 224 includes zirconium oxide. In some embodiments, the first portion 222 includes tantalum oxynitride, and the second portion 224 includes tantalum oxide.

The deposition process includes an atomic layer deposition (ALD) process, a chemical vapor deposition (CVD) process, or another suitable process. In some embodiments, the deposition process uses TMA (trimethyl aluminum; $Al(CH_3)_3$) as an aluminum source and uses $NH_3$ as a reaction gas.

Figure 2H:
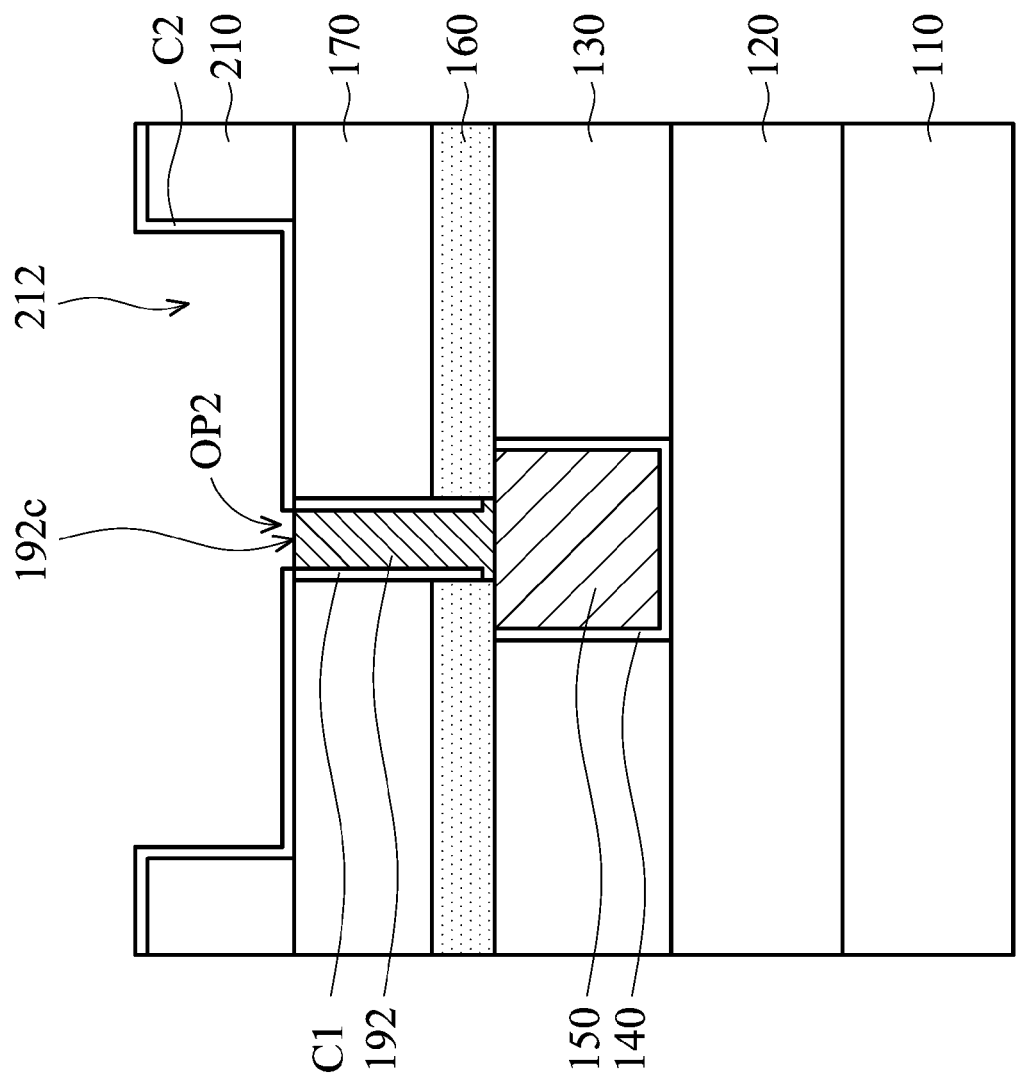

As shown in FIG. 2H, the first portion 222 is removed, in accordance with some embodiments. The removal process includes a selective etching process, in accordance with some embodiments. The selective etching process includes a wet etching process, in accordance with some embodiments.

Since the first portion 222 and the second portion 224 are made of different materials, the etchants of the selective etching process are able to remove the first portion 222 at a greater rate than the removal rate of the second portion 224, in accordance with some embodiments. As shown in FIG. 2H, after the removal process, the second portion 224 forms a cover layer C2, in accordance with some embodiments. The cover layer C2 has an opening OP2 exposing the conductive structure 192, in accordance with some embodiments.

Figure 2I:
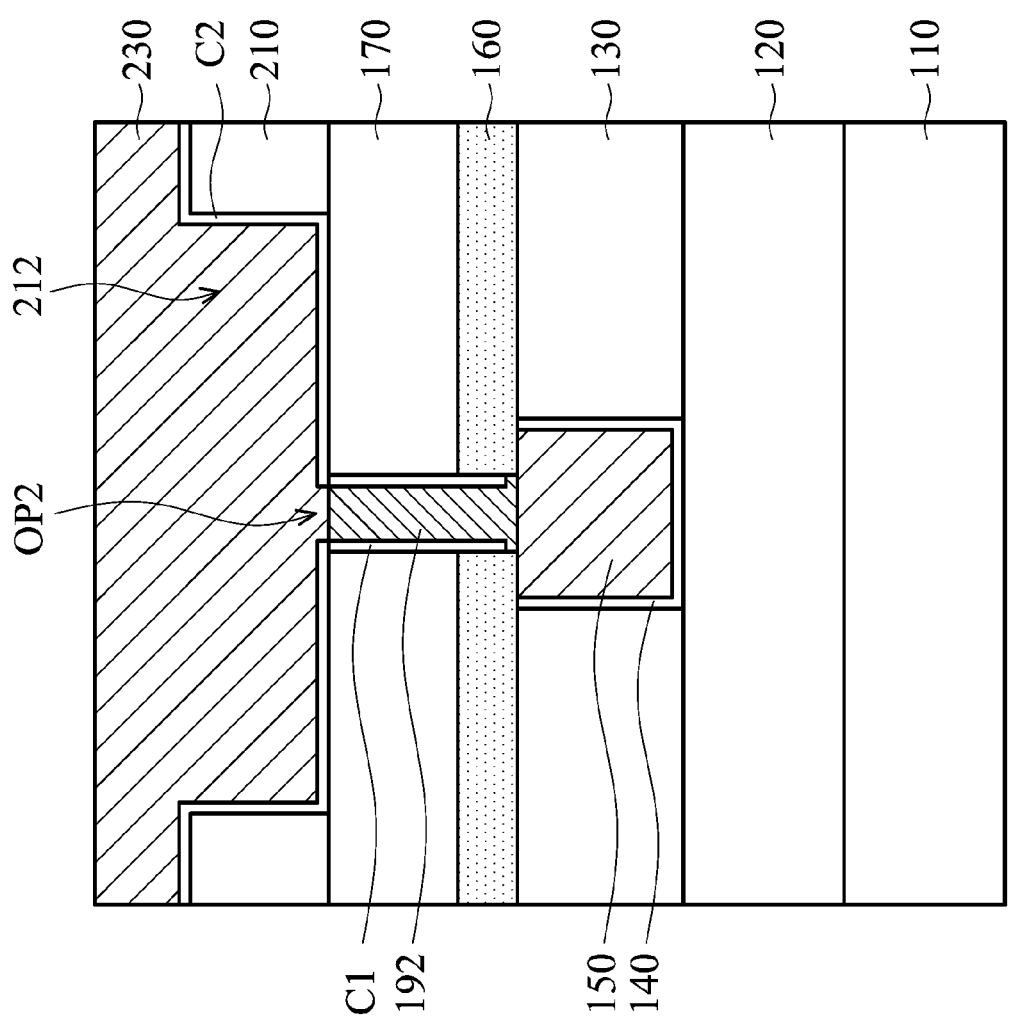

As shown in FIG. 2I, a conductive layer 230 is deposited over the cover layer C2 and the conductive structure 192 to fill the trench 212 and the opening OP2, in accordance with some embodiments. The conductive layer 230 includes copper, aluminum, tungsten, or another suitable conductive material. The conductive layer 230 is formed using a deposition process, in accordance with some embodiments. The deposition process includes a physical vapor deposition (PVD) process, a chemical vapor deposition (CVD) process, or another suitable deposition process.

Figure 2J:
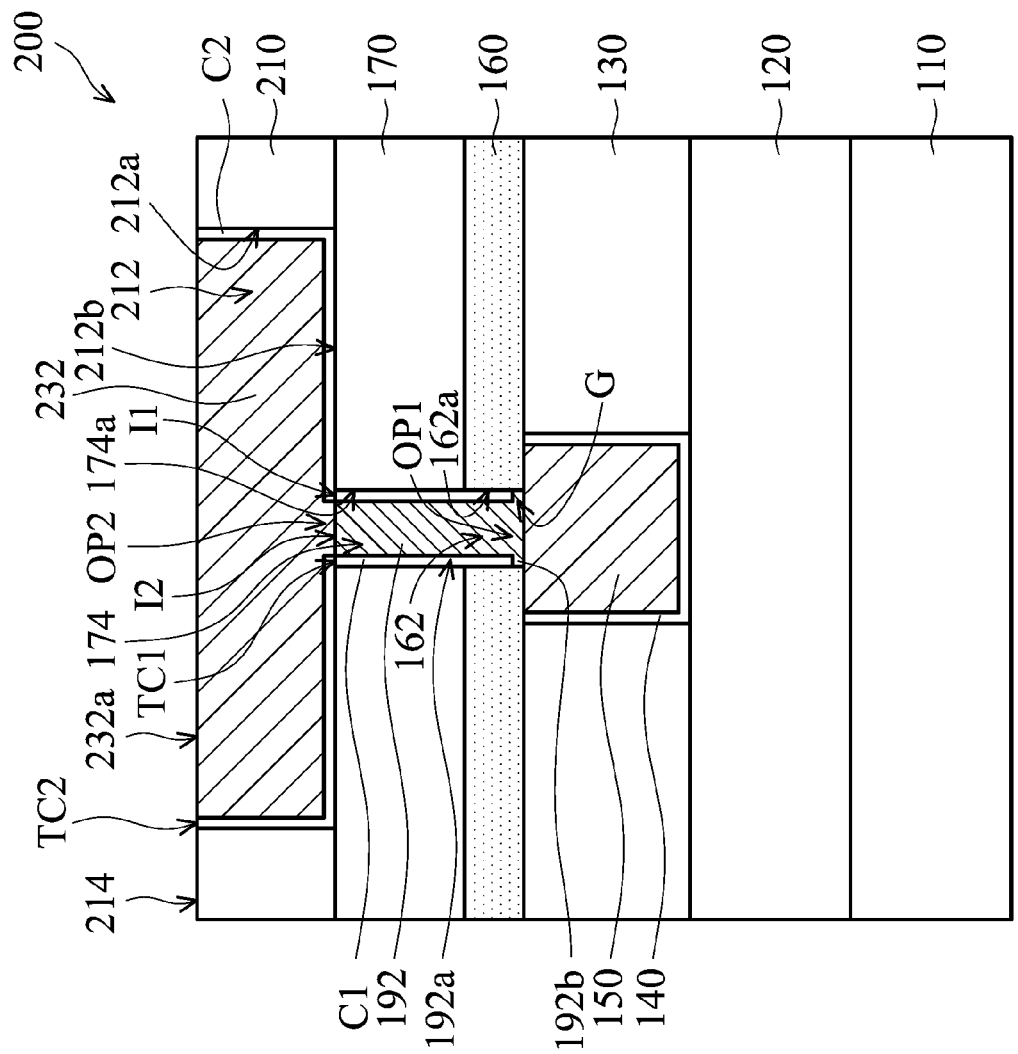

As shown in FIG. 2J, top portions of the conductive layer 230 and the cover layer C2 are removed, in accordance with some embodiments. The removal process includes a chemical mechanical polishing process, in accordance with some embodiments. After the removal process, the remaining conductive layer 230 forms a conductive line 232, in accordance with some embodiments. The conductive line 232 is also referred to as a conductive structure, in accordance with some embodiments.

The conductive line 232 is filled in the trench 212, in accordance with some embodiments. The conductive line 232 and the conductive structures 192 and 150 are electrically connected with each other, in accordance with some embodiments. After the removal process, top surfaces 214, TC2, and 232a of the dielectric layer 210, the cover layer C2, and the conductive line 232 are aligned with each other, in accordance with some embodiments.

The cover layers C1 and C2 are in direct contact with each other, in accordance with some embodiments. There is an interface I1 between the cover layers C1 and C2, in accordance with some embodiments. The cover layers C1 and C2 are made of the same material, in accordance with some embodiments. The cover layers C1 and C2 are made of different materials, in accordance with some embodiments.

There is an interface I2 between the conductive structure 192 and the conductive line 232, in accordance with some embodiments. The conductive structure 192 and the conductive line 232 are made of the same material, in accordance with some embodiments. The conductive structure 192 and the conductive line 232 are made of different materials, in accordance with some embodiments. In this step, a semiconductor device structure 200 is substantially formed, in accordance with some embodiments.

The conductive line 232 extends through the opening OP2 of the cover layer C2 and is therefore in direct contact with the conductive structure 192, in accordance with some embodiments. Since there is no barrier layer and no seal layer between the conductive line 232 and the conductive structures 192 and 150, the conductive structure 192 is able to be in direct contact with the conductive structure 150 and the conductive line 232, which reduces the resistance between the conductive structures 192 and 150 and the conductive line 232. Therefore, the performance of the semiconductor device structure 200 is improved, in accordance with some embodiments.

The cover layer C2 continuously covers the entire inner wall 212a and the entire bottom surface 212b of the trench 212 and the top surface TC1 of the cover layer C1, in accordance with some embodiments. The cover layer C1 surrounds only an upper portion 192a of the conductive structure 192, in accordance with some embodiments.

The cover layer C1 is in direct contact with the dielectric layer 170 and the etch stop layer 160, in accordance with some embodiments. The cover layer C1 is not in direct contact with the conductive structure 150 and the dielectric layer 210, in accordance with some embodiments.

The conductive structure 192 has an extending portion 192b extending between the cover layer C1 and the conductive structure 150, in accordance with some embodiments. The extending portion 192b separates the cover layer C1 from the conductive structure 150, in accordance with some embodiments. The extending portion 192b is filled in the gap G, in accordance with some embodiments.

In accordance with some embodiments, semiconductor device structures and methods for forming the same are provided. The methods (for forming the semiconductor device structure) form a deposition layer over an inner wall of an opening of a dielectric layer and a first conductive structure exposed by the opening. The deposition layer over the dielectric layer and the deposition layer over the first conductive structure are made different materials. The methods selectively remove the deposition layer over the first conductive structure and fill a second conductive structure into the opening. Therefore, there is no deposition layer formed between the first conductive structure and the second conductive structure, which reduces the resistance between the first conductive structure and the second conductive structure. As a result, the performance of the semiconductor device structure is improved.

In accordance with some embodiments, a semiconductor device structure is provided. The semiconductor device structure includes a substrate. The semiconductor device structure includes a first conductive structure over the substrate. The semiconductor device structure includes a first dielectric layer over the substrate. The first dielectric layer has a first opening exposing the first conductive structure. The semiconductor device structure includes a cover layer covering a first inner wall of the first opening and having a second opening exposing the first conductive structure. The cover layer includes a metal oxide. The semiconductor device structure includes a second conductive structure filled in the first opening and surrounded by the cover layer. The second conductive structure is electrically connected to the first conductive structure.

In accordance with some embodiments, a semiconductor device structure is provided. The semiconductor device structure includes a substrate. The semiconductor device structure includes a first conductive structure over the substrate. The semiconductor device structure includes a first dielectric layer over the substrate. The first dielectric layer has a first opening exposing the first conductive structure. The semiconductor device structure includes a first cover layer covering a first inner wall of the first opening. The first cover layer includes a metal oxide. The semiconductor device structure includes a second conductive structure filled in the first opening and surrounded by the first cover layer. The second conductive structure is in direct contact with the first conductive structure, and the second conductive structure has an extending portion extending between the first cover layer and the first conductive structure.

In accordance with some embodiments, a method for forming a semiconductor device structure is provided. The method includes forming a first conductive structure over a substrate. The method includes forming a dielectric layer over the substrate. The dielectric layer has an opening exposing the first conductive structure. The method includes performing a deposition process to form a deposition layer over the first conductive structure and the dielectric layer. The deposition layer has a first portion and a second portion. The first portion is over the first conductive structure. The second portion is over an inner wall of the opening. The first portion and the second portion are made of different materials. The method includes removing the first portion. The method includes filling a second conductive structure into the opening. The second conductive structure is surrounded by the second portion. The second conductive structure is electrically connected to the first conductive structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
    forming a first conductive structure over a substrate;
    forming a dielectric layer over the substrate, wherein the dielectric layer has an first opening exposing the first conductive structure;
    performing a deposition process to form a deposition layer over the first conductive structure and the dielectric layer, wherein the deposition layer has a first portion and a second portion, the first portion is over the first conductive structure, the second portion is over a first inner wall of the first opening, and the first portion and the second portion are made of different materials;
    removing the first portion; and
    filling a second conductive structure into the first opening, wherein the second conductive structure is surrounded by the second portion, and the second conductive structure is electrically connected to the first conductive structure.

2. The method for forming a semiconductor device structure as claimed in claim 1, wherein the first portion is made of a metal oxynitride, and the second portion is made of a metal oxide.

3. The method for forming a semiconductor device structure as claimed in claim 2, wherein the first portion and the second portion comprise a same metal element.

4. The method for forming a semiconductor device structure as claimed in claim 1, wherein the first portion is in direct contact with the second portion.

5. The method for forming a semiconductor device structure as claimed in claim 1, wherein the removal of the first portion comprises:
    performing a wet etching process on the first portion.

6. The method for forming a semiconductor device structure as claimed in claim 1, wherein before the removal of the first portion, the deposition layer conformally and continuously covers the first conductive structure and the dielectric layer.

7. The method for forming a semiconductor device structure as claimed in claim 1, wherein the first portion is in direct contact with the first conductive structure.

8. The method for forming a semiconductor device structure as claimed in claim 1, further comprising:
before the formation of the dielectric layer, forming an etching stop layer over the substrate, wherein the dielectric layer is formed over the etching stop layer, the etching stop layer has a second opening under the first opening and exposing the first conductive structure, the deposition layer covers a second inner wall of the second opening, the deposition layer does not cover a lower portion of the second inner wall after the removal of the first portion, and the second conductive structure is further filled into the second opening and in direct contact with the etching stop layer.

9. A method for forming a semiconductor device structure, comprising:
forming a first conductive structure over a substrate;
forming a first dielectric layer over the substrate, wherein the first dielectric layer has an first opening exposing the first conductive structure;
performing a deposition process to form a deposition layer over the first conductive structure and the first dielectric layer, wherein the deposition layer has a first portion and a second portion, the first portion is over the first conductive structure, the second portion is over a first inner wall of the first opening, and the first portion and the second portion are made of different materials;
removing the first portion to form a gap between the second portion and the first conductive structure; and
filling a second conductive structure into the first opening and the gap, wherein an upper portion of the second conductive structure is surrounded by the second portion, the second portion does not surround a lower portion of the second conductive structure in the gap, and the second conductive structure is in direct contact with the first conductive structure.

10. The method for forming a semiconductor device structure as claimed in claim 9, wherein the first portion is made of a metal oxynitride, the second portion is made of a metal oxide, and the first portion and the second portion comprise a same metal element.

11. The method for forming a semiconductor device structure as claimed in claim 9, further comprising:
forming a second dielectric layer over the substrate, wherein the first conductive structure is formed in the second dielectric layer; and
forming an etching stop layer over the second dielectric layer and the first conductive structure, wherein the etching stop layer has a second opening connected to the first opening and exposing the first conductive structure, the deposition layer further covers a second inner wall of the second opening, and the second conductive structure is further filled in the second opening.

12. The method for forming a semiconductor device structure as claimed in claim 11, wherein the gap is in the second opening.

13. The method for forming a semiconductor device structure as claimed in claim 11, wherein the gap has a height less than a thickness of the etching stop layer.

14. The method for forming a semiconductor device structure as claimed in claim 9, wherein the first dielectric layer further has a trench over and connected to the first opening, and the deposition layer continuously covers a second inner wall and a bottom surface of the trench and the first inner wall of the first opening.

15. The method for forming a semiconductor device structure as claimed in claim 9, wherein the deposition layer is in direct contact with the first dielectric layer and is not in direct contact with the first conductive structure.

16. A method for forming a semiconductor device structure, comprising:
forming a first conductive structure over a substrate;
forming a dielectric layer over the substrate, wherein the dielectric layer has an first opening exposing the first conductive structure;
forming a first deposition layer over the first conductive structure and the dielectric layer, wherein the first deposition layer has a first portion and a second portion, the first portion is over the first conductive structure, the second portion is over a first inner wall of the first opening, and the first portion and the second portion are made of different materials;
removing the first portion; and
forming a second conductive structure in the first opening, wherein the second conductive structure is surrounded by the second portion, a lower portion of the second conductive structure is between the second portion and the first conductive structure, and the second conductive structure is electrically connected to the first conductive structure.

17. The method for forming a semiconductor device structure as claimed in claim 16, further comprising:
forming a second dielectric layer over the first dielectric layer and having a trench over the first opening;
forming a second deposition layer over a second inner wall and a bottom surface of the trench, a first top surface of the second conductive structure, and a second top surface of the second portion, wherein the second deposition layer has a third portion and a fourth portion, the third portion is over the second conductive structure, the fourth portion is over the second inner wall, the bottom surface, and the second top surface, and the third portion and the fourth portion are made of different materials;
removing the third portion; and
filling a third conductive structure into the trench, wherein the third conductive structure is surrounded by the fourth portion and in direct contact with the second conductive structure.

18. The method for forming a semiconductor device structure as claimed in claim 17, wherein the fourth portion is in direct contact with the second portion, and there is an interface between the fourth portion and the second portion.

19. The method for forming a semiconductor device structure as claimed in claim 17, wherein the third portion is made of a metal oxynitride, the fourth portion is made of a metal oxide, and the third portion and the fourth portion comprise a same metal element.

20. The method for forming a semiconductor device structure as claimed in claim 17, wherein the formation of the second conductive structure comprises:
depositing a conductive layer over the dielectric layer and the second portion to fill the first opening; and removing the conductive layer and the second portion outside of the first opening.

* * * * *